United States Patent [19]

Allman et al.

[11] 4,093,107

[45] June 6, 1978

[54] SPRAYING EQUIPMENT

[75] Inventors: Denis John Allman, Chichester; Lionel Ivor Alfred Taylor, Southampton, both of England

[73] Assignee: E. Allman and Company Limited, England

[21] Appl. No.: 686,593

[22] Filed: May 14, 1976

[30] Foreign Application Priority Data

May 16, 1975 United Kingdom ............... 21028/75

[51] Int. Cl.² ............................................... B05B 9/06
[52] U.S. Cl. .................... 222/23; 222/614; 239/74; 239/156; 364/564
[58] Field of Search ............... 222/1, 23, 25, 40, 176, 222/178, 330, 613, 614, 626, 627; 180/105 R; 239/156, 155, 74; 73/114; 118/9, 10; 235/478, 479, 564, 565

[56] References Cited

U.S. PATENT DOCUMENTS

| 3,044,661 | 7/1962 | Cartwright | 222/25 |
| 3,236,415 | 2/1966 | Parker | 222/25 |
| 3,549,868 | 12/1970 | Watson | 73/114 X |
| 3,605,682 | 9/1971 | Groce et al. | 118/10 X |
| 3,679,098 | 7/1972 | Weiss | 222/23 |
| 3,782,634 | 1/1974 | Herman | 222/178 X |
| 3,949,602 | 4/1976 | Erwin | 73/114 |
| 3,983,372 | 9/1976 | Klaver | 73/114 X |

Primary Examiner—Robert B. Reeves
Assistant Examiner—Joseph J. Rolla
Attorney, Agent, or Firm—Browdy and Neimark

[57] ABSTRACT

A device for determining the volume of spraying liquid applied to unit area of ground by spraying equipment. The device includes pulse generators for generating first and second electrical signals respectively representing the rate of supply of liquid and the ground speed of the equipment. A function generating unit receives the two signals and, responding to these signals, produces an output signal representing the product of the ratio between the signals and a predetermined factor. The output signal from the comparator is applied to a meter which provides a visual indication of the output signal, this representing the volume of liquid applied to unit area of the ground. An automatic speed control unit can be coupled to an output from the function generating unit or to the means for generating the second electrical signal. This unit is actuated by an operator when the visual indicator indicates that a predetermined supply of liquid to unit area has been achieved. The unit then maintains the ground speed at a constant value.

9 Claims, 2 Drawing Figures

SPRAYING EQUIPMENT

BACKGROUND OF THE INVENTION

This invention relates to determining the volume of spraying liquid applied per unit area of the ground by spraying equipment.

In spraying fertilisers, weedkillers, pest killers or other liquids from agricultural or horticultural spraying equipment it is important to observe the dosage rate recommended by the manufacture. Under-dosing may result in failure to achieve the object of the spraying process. Over-dosing may render the process uneconomic, particularly when expensive liquids are in use.

Tar-spraying of the application of de-icing liquid to aircraft runways are two further examples of situations where it is important to determine the volume of spraying liquid applied to unit area of ground, particularly if the work is carried out on a contract basis.

SUMMARY OF THE INVENTION

According to the present invention, a device for determining the volume of spraying liquid which is applied per unit area of ground by spraying equipment comprises means for generating a first electrical signal representing the rate of supply of spraying liquid to the ground, means for generating a second electrical signal representing the speed at which the equipment is traversing the ground, function generating means, means for applying the first and second electrical signals to the function generating means, whereby the function generating means generate an output signal representing the ratio between the said first and second electrical signals, which ratio represents the ratio between the volume of spraying liquid applied to the ground and the distance travelled by the equipment during application of that volume, and hence the volume of spraying liquid applied to unit area of the ground, and means for applying the said output signal to a visual indicator means, which provides a visual indication of the said volume applied to unit area of ground.

Preferably, the output signal from the function generating means is equal to the product of the said ratio and a predetermined factor representing the ratio between the distance travelled by the equipment and the area of ground to which spraying liquid is applied during travel over that distance. Control means may then be provided for manually adjusting the predetermined factor in accordance with the number of spraying nozzles, and hence the width of the area of ground to which spraying liquid is applied.

Preferably, the first electrical signal has a frequency which represents the rate of supply of spraying liquid to the ground, the second electrical signal has a frequency representing the speed at which the equipment is traversing the ground, and the function generating means are adapted to generate an output signal representing the ratio between the frequencies of respective first and second signals.

Suitably, each electrical signal is then a train of electrical pulses and the function generating means generate an output signal representing the ratio between the repetition rate of pulses in one train and the repetition rate of pulses in the other train.

Manually operate speed control means may be coupled to an output from the function generating means or to the means for generating the first electrical signal, the speed control means being operated when the visual indication on the visual indicator reaches a predetermined value and then serving to maintain the ground speed of the equipment equal or substantially equal to the speed at which the said predetermined value of the visual indication is obtained.

Further means may be provided for determining the total area of ground to which spraying liquid has been applied during a predetermined interval of time. Further means may be provided for determining the total volume of spraying liquid applied to the ground.

The present invention also includes a method of determining the volume of spraying liquid which is applied per unit area of ground by spraying equipment comprising generator a first electrical signal representing the rate of supply of spraying liquid to the ground, generating a second electrical signal representing the speed at which the equipment is traversing the ground, applying the first and second signals to function generating means, whereby the function generator means generate an output signal representing the ratio between the said first and second electrical signals, which ratio represents the ratio between the volume of spraying liquid applied to the ground and the distance travelled by the equipment during application of that volume, and hence the volume of spraying liquid applied to unit area of the ground, and applying the output signal to visual indicator means which provide a visual indication of the volume of liquid applied to unit area of ground.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
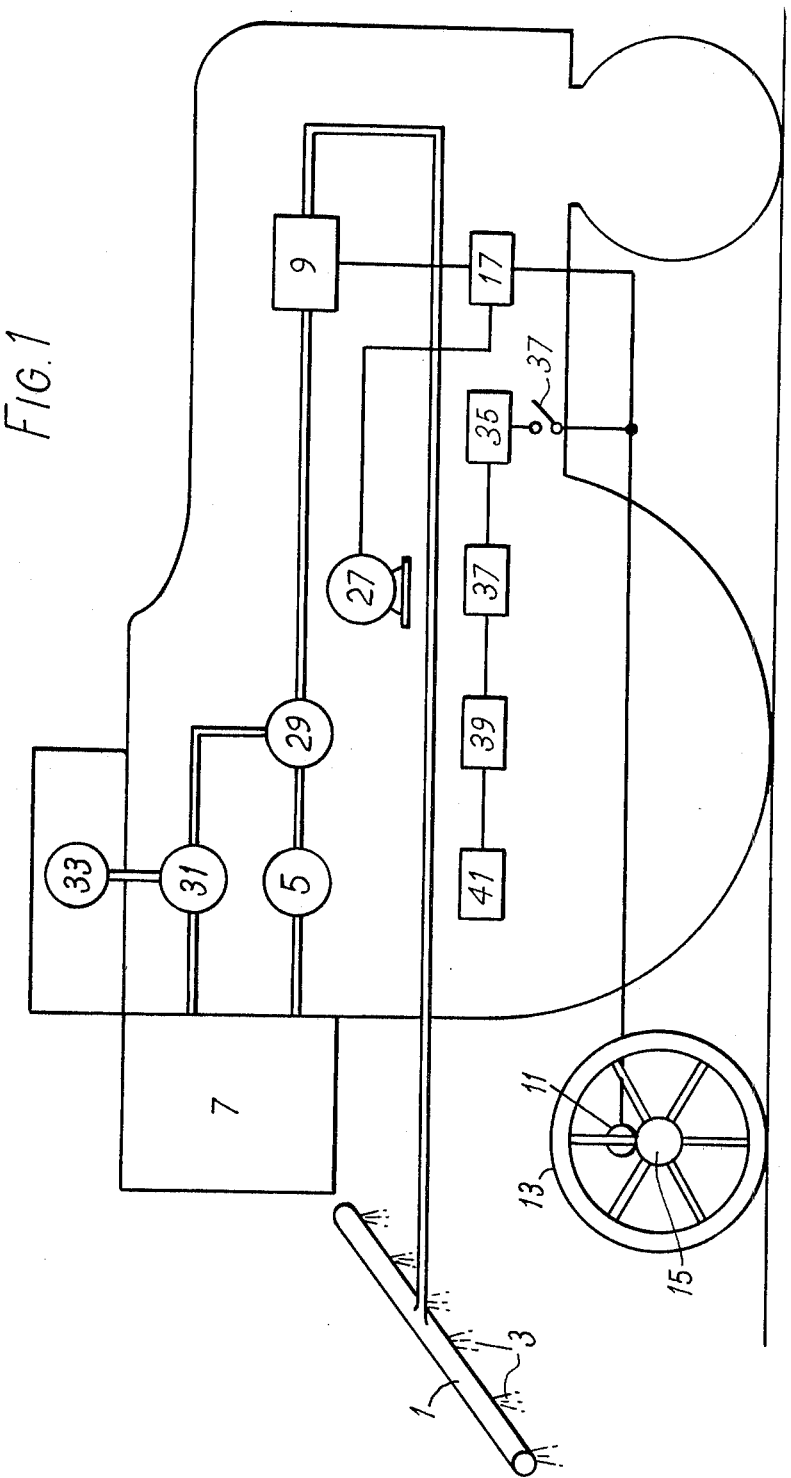
FIG. 1 is a schematic diagram of an agricultural spraying machine including a device according to the invention.

The machine shown in FIG. 1 is a tractor-mounted sprayer having a spraying boom 1 which extends transversely of the direction of travel of the machine. The boom 1 is provided with a series of spraying nozzles 3 which are equally spaced along the length of the boom and a pump 5 is provided for pumping liquid to the nozzles 3 from a spray tank 7 mounted on the tractor.

The present machine includes a device according to the invention for determining the volume of spraying liquid applied to unit area of the ground. To this end the device is adapted to generate two electrical signals, a first signal which represents the rate of supply of liquid to the boom and a second signal which represents the ground speed of the equipment, and then to effect a determination of the ratio of the signals.

For generating the first electrical signal a turbic or Doppler effect flowmeter 9 is connected into a delivery line from the pump 5 to the boom 1. The first signal takes the form of a train of pulses having a repetition frequency linearly proportional to the rate of flow of liquid to the boom 1.

For generating the second electrical signal a tachogenerator 11 is provided on a jockey wheel 13 associated with the device. The jockey wheel 13 is mounted at one end of an arm (not shown) whose other end is pivoted on the tractor or trailer, the wheel 13 being biased downwardly into engagement with the ground under the influence of its own weight and the weight of the arm. A friction disc 15 on the hub of the jockey wheel 11 engages the tachogenerator, which generates a second signal in the form of a train of pulses whose repetition frequency is linearly proportional to the ground speed of the machine.

The outputs of the flowmeter 9 and tachogenerator 11 are connected to respective flow and speed inputs of a function generating unit 17, wherein the ratio of the repetition frequencies of the signals is determined.

Figure 2:
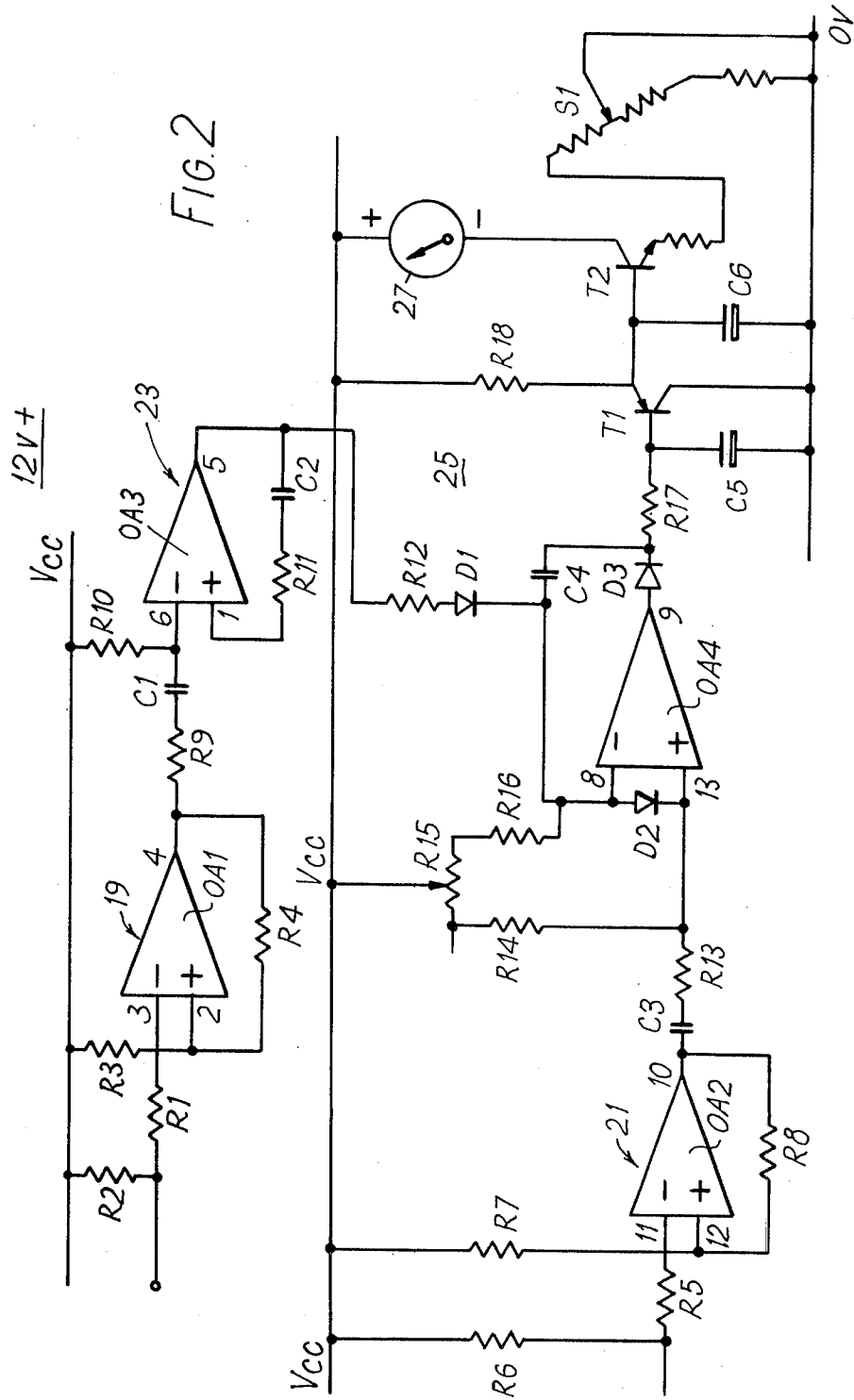
FIG. 2 is a circuit diagram of an electronic circuit which can be used for the function generating means in the machine of FIG. 1.

Referring to FIG. 2 of the drawings, the function generating unit 17 includes a speed pulse shaper 19, which is connected to the speed input to the unit, and a flow pulse shaper 21, which is connected to the flow input. A monostable 23 couples the pulse shaper 19 to an integrator 25 and an output from the pulse shaper 21 is also connected to the integrator. A meter 27 is included in an output circuit of the integrator 25.

As shown in FIG. 2, the speed input to the unit 17 is connected via a resistor R1 to an inverting input of an operational amplifier OA1 in the speed pulse shaper 19. The speed input is also connected via a resistor R2 to a positive line $V_{cc}$ from a stabilised voltage supply unit (not shown). A non-inverting input of the amplifier OA1 is connected to the line $V_{cc}$ by means of a resistor R3 and this input is also connected to an output of the amplifier via a resistor R4.

The flow pulse shaper 21 includes an operational amplifier OA2 corresponding to the amplifier OA1 of pulse shaper 19 and resistors R6, R7, R8 and R9 corresponding to resistors R1, R2, R3 and R4, respectively.

In the monostable 23 there is a third operational amplifier OA3 having an inverting input which is coupled via a resistor R9 and capacitor C1 to the output of amplifier OA1. A further resistor R10 connectes the inverting input of amplifier OA3 to the line $V_{cc}$. A non-inverting input of the amplifier OA3 is coupled to an output of the amplifier by a resistor R11 and capacitor C2, whilst a resistor R12 and diode D1 connect the output to the integrator 25.

The integrator 25 includes a fourth operational amplifier OA4 which has a non-inverting input coupled to the output of amplifier OA2 via a resistor R13 and a capacitor C3. The non-inverting input of amplifier OA4 is also connected to an inverting input by means of a diode D2 and via a biasing network made up of resistors R14, R15 and R16 connected together in series. The resistor R15 is a variable resistor having a movable contact thereof connected to the line $V_{cc}$. A capacitor C4 connects the inverting input of amplifier OA4 to a diode D3 at the output of the amplifier, the input to the integrator 25 from the monostable 23 being provided at the junction between capacitor C4 and the inverting input of the amplifier OA4.

In an input circuit of the integrator 25 there is first a transistor T1 having a base electrode connected to the diode D3 via a resistor R17 and connected to earth potential via a capacitor C5. An emitter electrode of the transistor T1 is connected to the line $V_{cc}$ by a resistor R18 and a collector electrode is connected directly to earth potential.

A second transistor T2 has a base electrode connected directly to the emitter of transistor T1 and connected via a capacitor C6 to earth potential. An emitter electrode of the transistor T2 is connected to earth via a resistor R19 and a nozzle selector switch S1. The switch S1 is made up of eight resistors connected in series and a stepping contact which is connected to earth potential and is movable between positions wherein one or more resistors are short circuited. The above-mentioned meter 27, which is a direct voltage meter, is connected between a collector electrode of the transistor T2 and the line $V_{cc}$.

It will be appreciated that the present device is calibrated by the manufacturer to suit the form of flowmeter 9 and tachogenerator 11 employed, the relationship between the dimensions of the jockey wheel 13 and the tachogenerator 11, and the width of the area of ground which is sprayed when a predetermined number of nozzles 3 are used. Before using the device, however, an operator must adjust the nozzle selector switch S1 to suit the number of nozzles 3 he intends to use. For example, if the operator uses more than the predetermined number of nozzles 3 the spraying liquid is applied to a wider area and the volume per unit area is reduced. The nozzle selector switch S1 is therefore calibrated to suit the use of different numbers of nozzles 3, the greater the number of nozzles in use the greater the number of resistors of the selector switch S1 connected between the resistor R19 and earth potential when the stepping contact of the switch is moved to the appropriate position.

In the present machine liquid in the tank 7 is agitated by re-circulating excess liquid from the outlet of pump 5 back to the tank. To this end a control valve 29 is provided in the delivery line from the pump 5 and a return line extends from the valve 29 to the tank 7.

Included in the return line is a minimum flow switch 31 including a swinging vane (not shown) which is urged in one direction by liquid flowing along the line and is biased in the opposite direction by a spring. A microswitch or magnetic reed switch is coupled to the vane and is connected in an electrical circuit with a warning light 33. The vane, switch and light 33 serve as a warning device when the degree of agitation of liquid in the tank 7 falls below a predetermined value, as hereinafter described.

Referring again to FIG. 1, the present device also includes manually operable means for maintaining the ground speed of the tractor constant once the speed has reached a value corresponding to the spraying of a predetermined volume of liquid per unit area of the ground. The manually operable means includes a tractor speed control unit 35 which is connected to the output from the tachogenerator 11 via a switch 37. An output from the unit 35 is connected to a solenoid operated valve 37 controlling the supply of fluid to a vacuum actuator 39 for a throttle 41 of the tractor.

In use, the nozzle selector switch S1 is moved to the appropriate position and the control valve 29 is adjusted to provide a flow of liquid to the boom 1 in accordance with the number of nozzles 3 used and the desired volume per unit area of spraying. The machine is then driven forwardly with the jockey wheel 13 engaging the ground.

As mentioned above, the flowmeter 9 provides a train of pulses whose repetition frequency is linearly proportional to the rate of flow of liquid to the boom 1 and the tachogenerator 11 produces a second train of pulses whose repetition frequency is linearly proportional to the ground speed of the machine. For a ground speed of 1 to 10 miles per hour the tachogenerator 11 produces pulses of repetition frequency from 10Hz to 100Hz. The flowmeter 9 produces pulses of repetition frequency from 250Hz to 5,000Hz. Both trains of pulses are applied to the comparator 17.

In the function generating unit 17 the train of pulses from the tachogenerator 11 is first converted to a train of pulses of constant width and constant amplitude by the speed pulse shaper 19. The pulses from the pulse shaper 19 are then applied to the monostable 23 via the resistor R9 and capacitor C1. For each pulse from the pulse shaper 19 the monostable 23 generates a pulse which in turn is applied to the integrator 25.

Pulses from the flowmeter 9 are likewise shaped by the flow pulse shaper 21 and then applied via the capacitor C3 and resistor R13, which serve to supply a charge proportional to the value of the capacitor at a frequency proportional to flow rate to the non-inverting input of the operational amplifier OA4 in the integrator 25. The diode D2 at the input to the amplifier OA4 causes the amplifier to be triggered at both the leading and trailling edges of each input pulse, thus doubling the effective repetition frequency of the pulse shaper 21.

Each time a pulse is applied to the non-inverting input of the amplifier OA4 there is a predetermined increase in the voltage at the output of the amplifier and in the charge on the capacitor C4. The output voltage of amplifier OA4 is therefore one which increases in steps and has a magnitude proportional at any instant in time to the number of pulses received from the pulse shaper 21 since the amplifier OA4 was last re-set. Resetting is effected each time a pulse is applied to the capacitor C4 from the monostable 23.

In the result, the output from the amplifier OA4 is formed of a series of positive-going, stepped or staircase pulses, each stepped pulse having a number of steps, and hence achieving a maximum value, proportional to the number of pulses received from the pulse shaper 21 in the interval between two successive pulses from the monostable 23. The magnitude of each pulse is therefore proportional to the repetition frequency of pulses from the pulse shaper 21 and inversely proportional to the repetition frequency of pulses from the pulse shaper 19. It is therefore proportional to the rate of supply of liquid to the boom 1 divided by the forward speed of the machine, i.e., to the volume of liquid applied to unit area of ground.

The stepped pulses from the amplifier OA4 are applied via the resistor R17 and capacitor C5 to the transistor T1, which is cut-off for the duration of each pulse. Positive-going pulses from the emitter of transistor T1 are therefore applied to the capacitor C6, across which there is developed a direct voltage proportional to the magnitude of each pulse. This voltage is applied to the base of transistor T2, causing the transistor to conduct. A direct current which flows between the emitter and collector electrodes of the transistor T2 also flows through the meter 27. The magnitude of this current is representative of the volume of spraying liquid applied to unit area of the ground, as described above, adjusted in accordance with the number of nozzles 3 in use by the setting of the switch S1.

As the machine is driven over the ground the operator adjusts the speed of travel until he has achieved a speed at which spraying is effected at the required volume per unit area. The speed can then be kept constant by closing the switch 37. This actuates the unit 35, which controls the throttle 41 via the valve 37 and actuator 39.

It will be appreciated that the present device can be calibrated to give a reading in gallons per acre or liters per hectare.

The device determines the actual rate of flow of liquid to the boom 1 in relation to the forward speed of the machine. It does not rely upon a calculation of flowrate from a knowledge of the pressure applied to the liquid by the pump 5, the size of the spraying nozzles 3 and the viscosity of the spraying liquid. Errors in calibrating the nozzles 3, wear of the nozzles in use, errors in a pressure gauge and changes in viscosity of the liquid do not therefore affect the final reading. Further, errors which might arise from a speedometer instrument error are minimised by measuring the speed from electrical pulses produced by rotation of the jockey wheel 13.

If the rate at which liquid is returned to the tank 7 falls below a predetermined value the swinging vane in the return line is biased by the spring into a position where the microswitch or reed switch is operated. The warning light 33 then comes on to provide the operator with an indication that there is insufficient return flow to agitate liquid in the tank 7.

The device described above can be modified by connecting a counter to the output of the speed pulse shaper 21 in the comparator and to the nozzle selector switch S1. The counter is adapted to count the pulses from the pulse shaper 21 and to divide the result by a factor determined by the setting of the nozzle selector switch S1. The result is representative of the total area of ground sprayed by the equipment. It can be compared with the total volume of spraying liquid used in the same period of time, thus providing a check on the reading of the device itself.

The tachogenerator used in the above meter may include a light source, a chopper which is coupled to the jockey wheel and interrupts light from the source at a rate proportional to ground speed, and a photoelectric device. Alternatively, an electromagnetic generator can be used. In this case a series of small ceramic bar magnets may be encased in a plastics disc mounted coaxially of the jockey pulley, the magnets being disposed at respective equi-angularly spaced locations about the axis of the disc. A reed switch is mounted on the arm supporting the pulley and is so arranged that the switch is closed each time one of the magnets passes. Each closure of the switch produces a pulse of electric current in an associated circuit. This arrangement has the advantage that there are no moving parts exposed to mud, water, stones or chemicals which might interfere with the friction disc in the device described above. Another alternative is to incorporate the generator in the hub of the jockey wheel, which also avoids the need for the friction disc.

As an alternative to providing the jockey wheel, described above, a tachogenerator may be provided on one of the ground wheels of the spraying equipment itself. If the device is used for tractor mounted equipment the tachogenerator can be on a front or rear wheel of the tractor, and in the case of trailed equipment the tachogenerator can be on a trailer wheel.

Instead of using a tachogenerator a Doppler ultrasonic speed detection device can be used for generating an electrical signal representative of the speed of travel of the sprayer. The device includes a transmitter which is mounted at a high point on the tractor and transmits ultrasonic waves at a frequency of 1MHZ forwardly of the tractor and downwardly towards the ground at an angle of between 35° and 45°. This minimises fluctuation in the signal due to pitching of the tractor. Waves reflected from the ground or crops are received by a receiver, also mounted on the tractor. There is a Doppler shift in frequency between the transmitted and reflected waves, the amount of the shift being determined by the speed of the vehicle. The reflected waves are mixed with the transmitted waves and a beat signal, of frequency linearly proportional to the speed of the tractor, is produced. The beat frequency is compared with a signal representing the rate of flow of liquid to the spraying nozzles, as in the above device.

As an alternative to the swinging vane described above a flowmeter can be provided in the return line to the tank. An output signal from the flowmeter operates a warning light when the rate at which liquid is being returned to the tank falls below a predetermined value.

In the device described above, a moving coil meter 27 is used. An alternative device employs a digital meter having an L.E.D. display. This has the advantage of being robust and suitable for use under severe operating conditions which might adversely affect the accuracy and reliability of a moving coil instrument. A three-digit display also provides a greater degree of definition and reliability over a wide range of flow-rates (10 gallons per acre to 150 gallons per acre) which has to be covered.

In the alternative device pulses from a flow meter and pulses from a tachogenerator are fed to a counter. The counter counts the number of pulses received from the flowmeter and is re-set to a zero-count after a predetermined number of pulses (say 10) have been received from the tachogenerator. The number of flowmeter pulses received at each re-setting is displayed on the digital meter until the next re-setting. The slower the speed of travel of the machine, the greater the number of flow pulses received between each re-setting and thus the higher the gallons per acre indicated. As the speed is increased re-setting takes place more frequently and a lower gallons per acre figure is displayed. A scaling factor is again switched in to accommodate variations in the number of nozzles used. This is achieved by switching dividing ratios in the counter and pre-scaler.

Meters according to the invention can be used with tractor mounted and trailed mist blowers and pedestrian propelled sprayers.

A further device according to the invention corresponds to the device described above, apart from modifications to the function generating unit 17. In the further device an output of the flow pulse shaper is connected to an input to a flow integrator, which converts the pulses to a negative direct voltage, and an output of the flow integrator is in turn connected to one input of an output integrator. An output of the speed pulse shaper is connected to a second input of the output integrator. The nozzle selector switch and the meter are connected to the output of the output integrator.

In use, a device within the output generator generates a ramp voltage when the negative voltage from the flow integrator and the pulses from the speed pulse shaper are applied thereto. The ramp voltage increases in magnitude at a rate which is linearly proportional to the direct voltage from the flow integrator. The device is re-set, and the ramp voltage reduced to zero, each time one of the pulses from the speed pulse generator is received. In the result, the magnitude achieved by the ramp voltage is linearly proportional to the magnitude of the negative voltage and inversely proportional to the repetition frequency of the pulses from the speed pulse generator.

The magnitude is proportional therefore to the rate of supply of liquid to the boom divided by the forward speed of the equipment, i.e., to the volume of liquid applied to unit area of ground.

In the output integrator the ramp voltage is integrated to provide a direct voltage proportional to the amplitude of the ramp. The direct voltage is applied to the resistors of the selector switch and produces a reading on the meter connected thereto.

We claim:

1. A device for determining the volume of spraying liquid which is applied per unit area of ground by spraying equipment comprising means for generating a first electrical signal representing the rate of supply of spraying liquid to the ground, means for generating a second electrical signal representing the speed at which the equipment is traversing the ground, function generating means, means for applying said first and said second electrical signals to said function generating means for generating in response thereto an output signal equal to the product of a predetermined factor and the ratio between the first and second signals, the said predetermined factor representing the ratio between the distance travelled by the equipment and the area of ground to which spraying liquid is applied during travel over that distance so that the output signal represents the volume of spraying liquid applied to unit area of the ground, and means for applying said output signal to a visual indicator means, which provides a visual indication of said volume applied to unit area of ground.

2. A device as claimed in claim 1 including further means for determining the total area of ground to which spraying liquid has been applied during a predetermined interval of time.

3. A device as claimed in claim 1 including further means for determining the total volume of spraying liquid applied to the ground.

4. Spraying equipment comprising a device as claimed in claim 1 wherein said means for generating said first electrical signal are coupled to a ground engaging wheel of the equipment and said means for generating said second electrical signal are connected to a supply line from a tank for spraying liquid to one or more spraying nozzles.

5. A device as claimed in claim 1, wherein said first electrical signal has a frequency which represents the rate of supply of spraying liquid to the ground, said second electrical signal has a frequency representing the speed at which the equipment is traversing the ground, and said function generating means are function generating means for generating an output signal representing said ratio between said frequencies of respective first and second signals.

6. A device as claimed in claim 5, wherein each said electrical signal is a respective train of electrical pulses and said function generating means are function generating means for generating an output signal representing the ratio between the repetition rate of pulses in one train and the repetition rate of pulses in the other train.

7. A device of determining the volume of spraying liquid which is applied per unit area of ground by spraying equipment comprising means for generating a first electrical signal representing the rate of supply of spraying liquid to the ground, means for generating a second electrical signal representing the speed at which the equipment is traversing the ground, function generating means, means for applying said first and said second electrical signals to said function generating means for generating in response thereto an output signal equal to the product of a predetermined factor and the ratio between the first and second signals, the said predetermined factor representing the ratio between the distance travelled by the equipment and the area of ground to which spraying liquid is applied during travel over that distance so that the output signal represents the volume of spraying liquid applied to unit area of the ground, and means for applying said output signal to a visual indicator means, which provides a visual indication of said volume applied to unit area of ground and including control means for manually adjusting said predetermined factor in accordance with the number of spraying nozzles, and hence the width of the area of ground to which spraying liquid is applied.

8. A device of determining the volume of spraying liquid which is applied per unit area of ground by spraying equipment comprising means for generating a first electrical signal representing the rate of supply of spraying liquid to the ground, means for generating a second electrical signal representing the speed at which the equipment is traversing the ground, function generating means, means for applying said first and said second electrical signals to said function generating means for generating in response thereto an output signal equal to the product of a predetermined factor and the ratio between the first and second signals, the said predetermined factor representing the ratio between the distance travelled by the equipment and the area of ground to which spraying liquid is applied during travel over that distance so that the output signal represents the volume of spraying liquid applied to unit area of the ground, and means for applying said output signal to a visual indicator means, which provides a visual indication of said volume applied to unit area of ground and including manually operable speed control means coupled to an output from said means for generating said first electrical signal, said speed control means being operated when the visual indication on said visual indicator means reaches a predetermined value and being operative to maintain the ground speed of the equipment equal or substantially equal to the speed at which said predetermined value of the visual indication is obtained.

9. A device of determining the volume of spraying liquid which is applied per unit area of ground by spraying equipment comprising means for generating a first electrical signal representing the rate of supply of spraying liquid to the ground, means for generating a second electrical signal representing the speed at which the equipment is traversing the ground, function generating means, means for applying said first and said second electrical signals to said function generating means for generating in response thereto an output signal equal to the product of a predetermined factor and the ratio between the first and second signals, the said predetermined factor representing the ratio between the distance travelled by the equipment and the area of ground to which spraying is applied during travel over that distance so that the output signal represents the volume of spraying liquid applied to unit area of the ground, and means for applying said output signal to a visual indicator means, which provides a visual indication of said volume applied to unit area of ground and including manually operable speed control means coupled to an output from said function generating means and responsive thereto, said speed control means being operated when the visual output indication on said visual indicator means reaches a predetermined value and being operative to maintain the ground speed of the equipment equal or substantially equal to the speed at which said predetermined value of indication is obtained.

* * * * *